US007262098B2

(12) United States Patent
Alessandri et al.

(10) Patent No.: US 7,262,098 B2
(45) Date of Patent: Aug. 28, 2007

(54) MANUFACTURING PROCESS OF A SEMICONDUCTOR NON-VOLATILE MEMORY CELL

(75) Inventors: Mauro Alessandri, Vimercate (IT); Barbara Crivelli, Milan (IT); Romina Zonca, Paullo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 438 days.

(21) Appl. No.: 10/323,615

(22) Filed: Dec. 18, 2002

(65) Prior Publication Data

US 2003/0224563 A1 Dec. 4, 2003

(30) Foreign Application Priority Data

Dec. 28, 2001 (EP) .................................. 01830831
Jun. 28, 2002 (EP) .................................. 02014408

(51) Int. Cl.
*H01L 29/78* (2006.01)
(52) U.S. Cl. .................... 438/261; 257/E29.264
(58) Field of Classification Search ............... 438/294, 438/257, 258, 528, 593, 270, 201, 211, 261, 438/266, 264, 260; 257/981, 326, 316–319, 257/336, E29.264, E29.3, E29.303, E29.304
See application file for complete search history.

(56) References Cited

U.S. PATENT DOCUMENTS

| 5,349,494 | A | * | 9/1994 | Ando ......................... 361/322 |
| 5,897,354 | A | * | 4/1999 | Kachelmeier ............... 438/264 |
| 5,907,780 | A | * | 5/1999 | Gilmer et al. ............... 438/299 |
| 5,998,264 | A | * | 12/1999 | Wu ............................. 438/260 |
| 6,008,091 | A | * | 12/1999 | Gregor et al. .............. 438/261 |
| 6,020,243 | A | | 2/2000 | Wallace et al. ............. 438/287 |
| 6,060,406 | A | * | 5/2000 | Alers et al. ................. 438/785 |
| 6,060,755 | A | * | 5/2000 | Ma et al. ..................... 257/410 |
| 6,163,049 | A | | 12/2000 | Bui ............................. 257/321 |
| 6,184,072 | B1 | | 2/2001 | Kaushik et al. ............. 438/197 |
| 6,362,045 | B1 | * | 3/2002 | Lin et al. .................... 438/257 |
| 6,423,619 | B1 | * | 7/2002 | Grant et al. ................ 438/589 |
| 6,531,347 | B1 | * | 3/2003 | Huster et al. ............... 438/164 |
| 6,562,491 | B1 | * | 5/2003 | Jeon ............................ 428/697 |
| 6,677,640 | B1 | * | 1/2004 | Sandhu et al. ............. 257/324 |
| 6,806,145 | B2 | * | 10/2004 | Haukka et al. ............. 438/287 |
| 6,812,514 | B1 | * | 11/2004 | Yang et al. ................. 257/314 |
| 6,844,604 | B2 | * | 1/2005 | Lee et al. .................... 257/410 |
| 2001/0044187 | A1 | | 11/2001 | Joo et al. .................... 438/264 |
| 2002/0137317 | A1 | * | 9/2002 | Kaushik et al. ............. 438/585 |
| 2004/0121534 | A1 | * | 6/2004 | Lin et al. .................... 438/257 |

* cited by examiner

FOREIGN PATENT DOCUMENTS

WO      WO 00/77838 A1    12/2000

*Primary Examiner*—Carl Whitehead, Jr.
*Assistant Examiner*—Jennifer M Dolan
(74) *Attorney, Agent, or Firm*—Lisa K. Jorgenson; E. Russell Tarleton; Seed IP Law Group PLLC

(57) ABSTRACT

A process for manufacturing a non-volatile memory cell having at least one gate region, the process including the steps of depositing a first dielectric layer onto a semiconductor substrate; depositing a first semiconductor layer onto the first dielectric layer to form a floating gate region of the memory cell; and defining the floating gate region of the memory cell in the first semiconductor layer. The process further includes the step of depositing a second dielectric layer onto the first conductive layer, the second dielectric layer having a higher dielectric constant than 10. Also disclosed is a memory cell integrated in a semiconductor substrate and having a gate region that has a dielectric layer formed over a first conductive layer and having a dielectric constant higher than 10.

91 Claims, 4 Drawing Sheets

MANUFACTURING PROCESS OF A SEMICONDUCTOR NON-VOLATILE MEMORY CELL

BACKGROUND OF THE INVENTION

1. Field of the Invention

The present invention relates to a manufacturing process of a semiconductor non-volatile memory cell, and to the corresponding memory cell, and more particularly, to the manufacture of a non-volatile memory cell, e.g., of the flash EEPROM type, having an interpoly dielectric layer of reduced electrical thickness, for a given number of interpoly dielectric layers, to ensure proper performance of the device as regards its electrical characteristics and retention of a logic state programmed therein.

The invention further relates to a process for manufacturing, either to a very large integration scale or single wafer scale, flash EEPROM non-volatile memory devices exhibiting the above features.

2. Description of the Related Art

As is well known in this technical field, re-programmable non-volatile memory cells integrated in a semiconductor substrate, particularly flash EEPROM cells, comprise a floating gate FET (Field-Effect Transistor), and an interpoly dielectric layer provided between the floating gate region and the control gate region to function as an insulator layer of charges stored into the floating gate region. The absence or presence of charges in the floating gate region sets the logic state of the memory cell, usually by a binary code of 0 or 1.

The interpoly dielectric layer can be formed from different materials in a number of different ways. A common technique is that of successively depositing three dielectric layers onto the floating gate region, the latter being comprised conventionally of an amorphous or polycrystalline silicon layer (polysilicon layer) deposited onto a thin layer of silicon oxide, known as the tunnel oxide, to isolate the gate region from the semiconductor substrate. The resulting stack dielectric layer usually comprises a first silicon oxide layer, a second silicon nitride layer, and a third silicon oxide layer. The resulting dielectric is known by the ONO acronym (Oxide Nitride Oxide), or as the interpoly ONO dielectric.

Within the ONO layer, the capability of the cell to retain its logic state is provided essentially by the two layers of silicon oxide. The nitride layer is used to promote the integration of the three-stack layer to the device process flow. The interpoly dielectric forming step is followed by treatments with oxidizing species ($O_2$, O, OH, $H_2O$). The nitride layer is impervious to said oxidizing species, and is therefore used as a barrier to stop them from diffusing through to the floating gate region. Thus, the nitride layer prevents further oxidation of the floating gate region and consequent alteration of the interpoly dielectric layer thickness during subsequent device manufacturing steps. In the state of the art, the need to maintain a nitride layer of sufficient thickness to function as a barrier against later thermal treatment, and the need to keep the ONO layer retention properties unchanged, inhibit reducing the overall electrical thickness of the three-stack layer to less than 14 nm. Alternatively, with memory cells that require no particularly thin interpoly dielectric or that are subjected to no post-formation oxidizing treatments, a single silicon oxide layer (single oxide interpoly) may be used instead of the ONO layer.

The thickness of the interpoly dielectric layer is co-responsible, irrespective of its composition and manufacturing method, for the capacitive coupling of the memory cell. Thus, additionally to retaining the logic state over time, it contributes to set the program and erase parameters.

The extant demand for miniaturization of electronic devices and for lower power usage, involving lower device bias voltages, requires that the thickness of the active dielectric layers be reduced at no performance loss.

The underlying technical problem is to provide a memory cell manufacturing process, whereby the EOT (Equivalent Oxide Thickness) of the dielectric layer between the floating gate and control gate regions can be reduced while maintaining the same fisic thickness and achieving good capacitive coupling of the floating and control gate regions.

BRIEF SUMMARY OF THE INVENTION

The disclosed embodiments of this invention provide a dielectric layer between the floating and control gate regions as a layer having a high dielectric constant value. Advantageously, this dielectric layer having a high dielectric constant value is formed by conventional and unconventional deposition techniques for non-volatile memories.

For easier process integration and improved electric properties of this dielectric layer having a high dielectric constant value, additional dielectric layers are deposited between the layer having a high dielectric constant value and the floating and control gate regions.

In accordance with one embodiment of the invention a manufacturing process is provided that includes depositing a first dielectric layer onto said semiconductor substrate; depositing a first semiconductor layer onto said first dielectric layer to form said floating gate region of said gate region; defining said floating gate region of said gate region in said first semiconductor layer; and depositing a second dielectric layer, having a higher dielectric constant than 10, onto said first semiconductor layer.

In accordance with another embodiment of the invention, a memory cell is provided that includes at least a source region and a drain region separated by a channel region, and having a gate region formed on said channel region and isolated from said semiconductor substrate by a first dielectric layer formed on said semiconductor substrate, said gate region comprising a floating gate region and a control gate region that are isolated from each other by an interpoly dielectric layer, with said floating gate region comprising a semiconductor layer; characterized in that said interpoly dielectric layer comprises a second dielectric layer having a higher dielectric constant than 10.

BRIEF DESCRIPTION OF THE SEVERAL VIEWS OF THE DRAWINGS

The features and advantages of the manufacturing process and the memory cell according to the invention will be apparent from the following description of embodiments thereof, given by way of non-limitative examples with reference to the accompanying drawings, wherein.

DETAILED DESCRIPTION OF THE INVENTION

Figure 1:
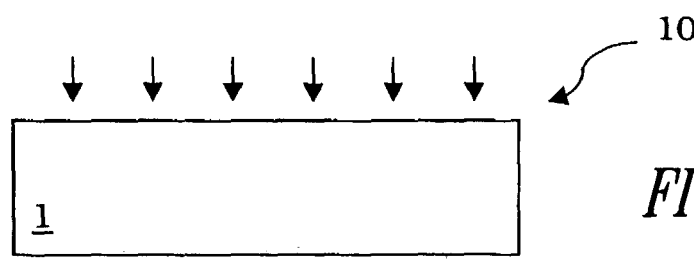
FIGS. 1 and 2 are schematic enlarged vertical cross-section views of a first embodiment of a portion of a memory cell during a sequence of the processing steps according to the invention.

With reference to the drawing views, a gate region of a non-volatile memory cell during a sequence of processing steps according to this invention is shown generally at 10 in schematic form in the figures.

The process steps and structures to be described are not exhaustive of an integrated circuit manufacturing process, it being possible for this invention to be implemented in conjunction with the integrated circuit manufacturing techniques currently employed in the industry, and only such process steps as are necessary to an understanding of the various embodiments of the invention will be described hereinafter.

The cross-sectional views of an integrated circuit during its manufacturing steps are not drawn to scale but rather to enhance significant features of the invention.

A non-volatile memory cell integrated in a semiconductor substrate comprises source and drain regions that are formed in the semiconductor substrate and separated from each other by a channel region on which a gate region is formed. The gate region is isolated from the semiconductor substrate by an oxide layer known as the tunnel oxide. The gate region consists of a first region, being the floating gate region, and a second region, being the control gate region, which regions are isolated from each other by a dielectric layer known as the interpoly dielectric.

This description of the embodiments of the invention concerns the formation of the gate region 10.

Figure 2:
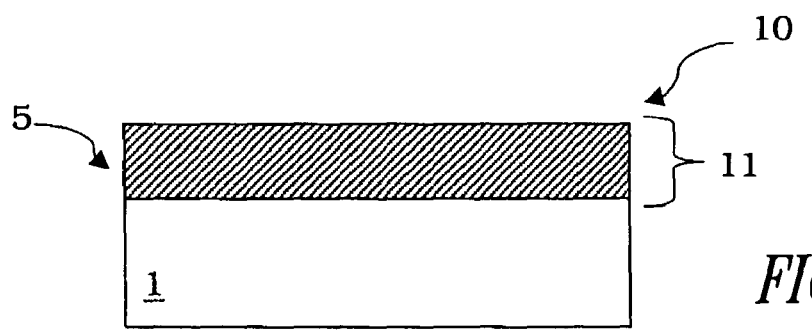

A layer 1 of a semiconductor material, such as polysilicon or polysilicon alpha silicon, is formed over a semiconductor substrate, as shown in FIGS. 1-2, and is isolated from this substrate by a tunnel oxide layer, not shown. This polysilicon layer 1 is used for forming the floating gate region of the memory cell.

The floating gate region is then defined conventionally in the polysilicon layer 1 by exposing a mask of a photo-sensitive material, and subsequently etching away the polysilicon layer 1, this being followed by removal of the mask of photo-sensitive material.

Advantageously, a treatment for cleaning the surface of said polysilicon layer 1 with chemical solution is provided.

The treatment is provided with chemical solution, using either aqueous solutions to form a layer of native oxide, not shown, over the polysilicon layer, or chemical treatment with hydrofluoric acid to passivate the surface of the polysilicon layer 1 with Si—H terminations, e.g., in a HF-last process. Advantageously, the treatment comprising hydrofluoric acid is additivated chelate agents, in liquid or vapor phase, to provide a cleaner surface of the polysilicon layer 1.

An interpoly dielectric layer 11 is formed over the floating gate region. According to this embodiment of the invention, the interpoly dielectric layer 11 comprises a layer 5 having a high dielectric constant.

Advantageously, the dielectric layer 5 with a high dielectric constant is a layer having a dielectric constant higher than 10. The dielectric layer 5 with a high dielectric constant is formed by a single layer of metal aluminate $MAl_xO_y$ or of metal silicate ($MSi_xO_y$), for example.

Advantageously, the dielectric layer 5 comprises transition metal compounds, e.g., of hafnium or zirconium.

The layer 5 with a high dielectric constant is a stack layer, also known as nano-laminate, comprising a stack of very thin layers (e.g., less than 25 Angstroms thick) of identical or different materials whose dielectric constant is higher than or equal to 3.9. The resulting layer 5 has a higher dielectric constant than 10.

Advantageously, the dielectric layer 5 with a high dielectric constant is deposited by ALCVD (Atomic Layer Chemical Vapor Deposition), MOCVD (Metal-Organic Chemical Vapor Deposition), LPCVD (Low-Pressure Chemical Vapor Deposition), PECVD (Plasma-Enhanced Chemical Vapor Deposition), or using PVD (Physical Vapor Deposition) or MBE (Molecular Beam Epitaxy) techniques, in either batch or single-wafer systems.

The thickness of the dielectric layer 5 is selected between 0.5 and 14 nm, as measured in terms of EOT equivalent electrical thickness. The physical thickness of the dielectric layer 5, e.g., with a dielectric constant of 10, would range between 1.2 and 36 nm.

After forming the dielectric layer 5, the layer 5 is densified by thermal treatment (using either nitrogen or steam or oxygen, $N_2$ or $H_2O$ or $O_2$), in either batch or single-wafer systems.

The gate region 10 of the memory cell is then finished conventionally by forming the control gate region in the dielectric layer 5.

This control gate region is formed as a second layer of a semiconductor material such as polysilicon, not shown.

Figure 3:
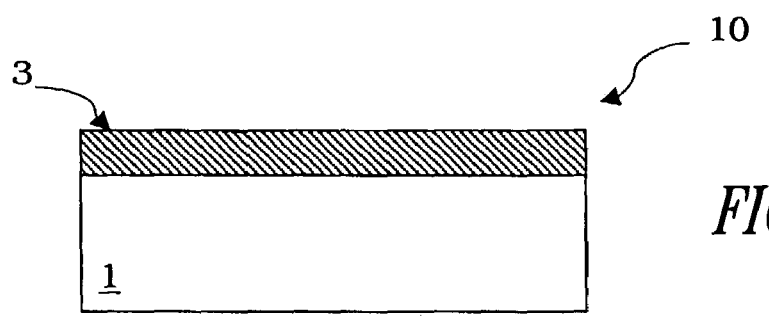
FIGS. 3 and 4 are schematic enlarged vertical cross-section views of a second embodiment of a portion of a memory cell during a sequence of the processing steps according to the invention.
Figure 4:
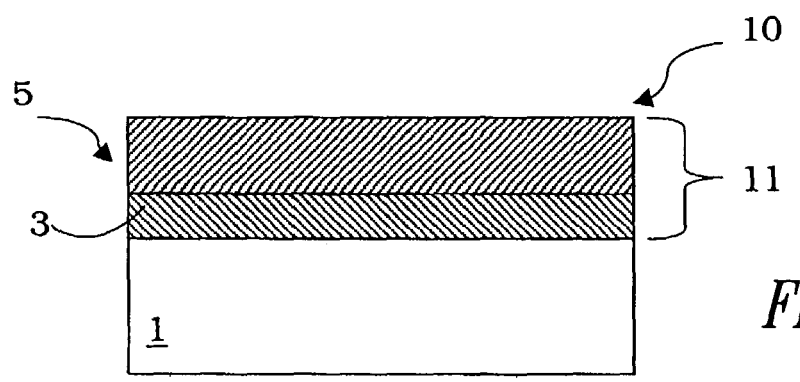

A second embodiment according to the invention is shown in FIGS. 3 and 4.

Elements having the same construction and function as in the first embodiment of FIG. 2 are denoted for clarity with the same reference numerals, and are not described further.

In particular, in the second embodiment of the invention, the interpoly dielectric layer 11 comprises the dielectric layer 5 with a high dielectric constant and another dielectric layer 3, known as the bottom dielectric. The bottom dielectric layer 3 is to isolate the dielectric layer 5 having a high dielectric constant from the floating gate region 1.

Advantageously, the bottom dielectric layer 3 is silicon dioxide, or a layer of a dielectric material whose dielectric constant is comprised in the range of 3.9 to 10.

The thickness of the bottom dielectric layer 3 can be selected in the range of 0.5 to 6.0 nm, it being understood that such values are measured in terms of EOT (Equivalent Oxide Thickness).

In one embodiment, the bottom dielectric layer 3 is an alumina layer, $Al_2O_3$, whose dielectric constant is comprised in the 9 to 10 range. The bottom dielectric layer 3 is CVD formed in either batch or single-wafer systems.

The gate region 10 of the memory cell is then finished conventionally by forming the control gate region in the dielectric layer 5.

Figure 5:
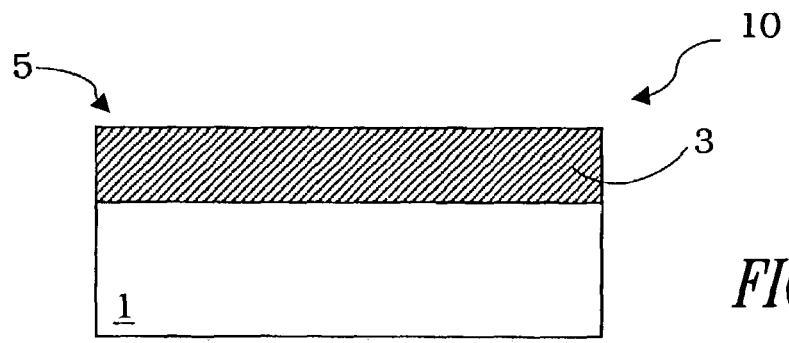
FIGS. 5 and 6 are schematic enlarged vertical cross-section views of a third embodiment of a portion of a memory cell during a sequence of the processing steps according to the invention.
Figure 6:
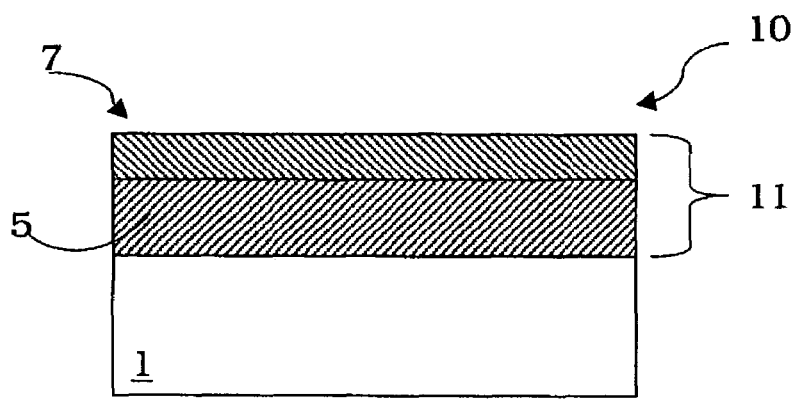

A third embodiment according to the invention is shown in FIGS. 5 and 6.

Elements having the same construction and function as in the embodiment of FIG. 2 are denoted for clarity with the same reference numerals, and no further described.

In particular, in the third embodiment of the invention, the interpoly dielectric layer 11 comprises the dielectric layer 5 with a high dielectric constant and an additional dielectric layer 7, known as the top dielectric.

In particular, the dielectric layer 5 with a high dielectric constant is formed over the polysilicon layer 1, and the top dielectric layer 7 is then formed over the dielectric layer 5 having a high dielectric constant. The top dielectric layer 7 may be a silicon dioxide layer or a layer of a dielectric material whose dielectric constant lies in the range of 3.9 to 10.

The thickness of the top dielectric layer 7 can be selected in the range of 0.5 to 10 nm, it being understood that such values are measured in terms of EOT.

Advantageously, the top dielectric layer 7 is a layer of aluminum oxide or alumina, $Al_2O_3$, having a dielectric constant in the 8 to 10 range. The top dielectric layer 7 is CVD formed in either batch or single-wafer systems.

The top dielectric layer 7 is then densified by thermal treatment (using either nitrogen or steam or oxygen, $N_2$ or $H_2O$ or $O_2$).

The gate region 10 of the memory cell is then finished conventionally by forming the control gate region in the dielectric layer 7.

Figure 7:
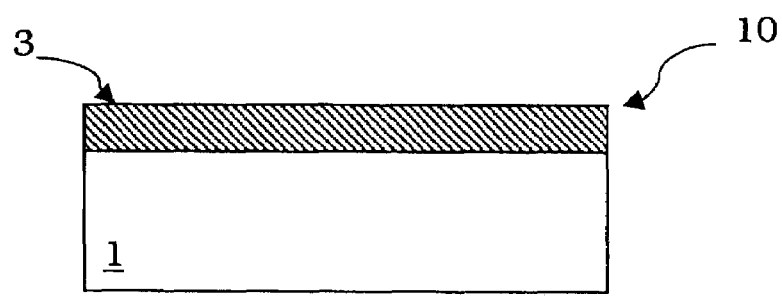
FIGS. 7 to 9 are schematic enlarged vertical cross-section views of a fourth embodiment of a portion of a memory cell during a sequence of the processing steps according to the invention.
Figure 8:
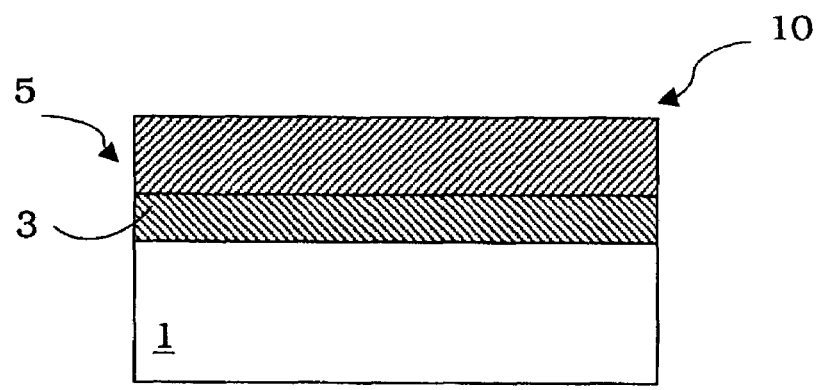
Figure 9:
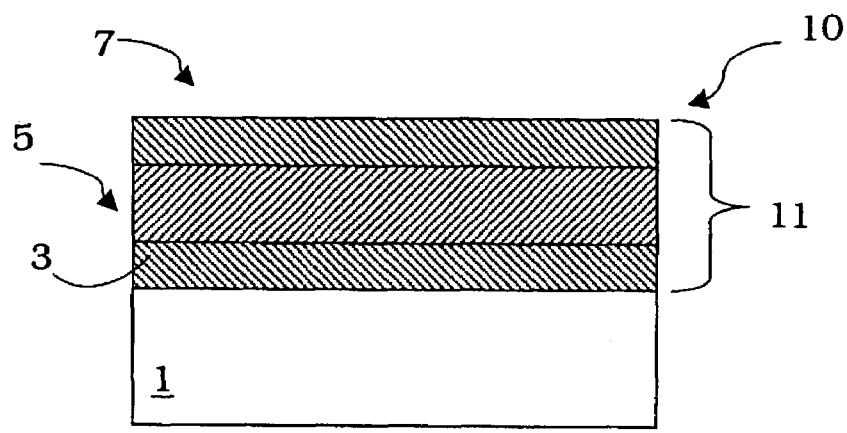

A fourth embodiment according to the invention is shown in FIGS. 7 to 9.

Elements having the same construction and function as in the embodiments of FIGS. 4 and 6 are denoted for clarity with the same reference numerals, and no further described.

In particular, in the fourth embodiment of the invention, the interpoly dielectric layer 11 comprises of the bottom dielectric layer 3 and the top dielectric layer 7. Thus, the dielectric layer 5 with a high dielectric constant is advantageously encapsulated between said layers.

By providing the bottom dielectric layer 3 and the top dielectric layer 7, the surface interfacing the dielectric layer 5 having a high dielectric constant with the semiconductor layers that form the gate region 10 can be advantageously improved.

The gate region 10 of the memory cell is then finished conventionally by forming the control gate region in the dielectric layer 7.

A fifth embodiment of the gate region 10 according to the invention is shown in FIGS. 10 to 17.

Elements having the same construction and function as in the previously described embodiments are denoted for clarity with the same reference numerals, and no further described.

In particular, in this embodiment of the invention, the interpoly dielectric layer 11 comprises a barrier layer, such as a layer of silicon nitride. This barrier layer is formed either in the floating gate region or over one of the layers that comprise the interpoly dielectric layer 11, as described in detail herein below.

Figure 10:
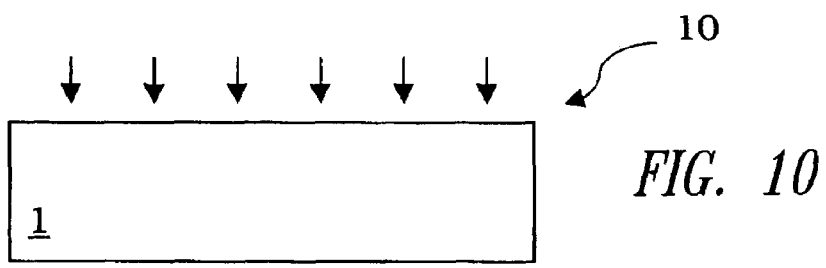
FIGS. 10 to 17 are schematic enlarged vertical cross-section views of a fifth embodiment of a portion of a memory cell during a sequence of the processing steps according to the invention.
Figure 11:
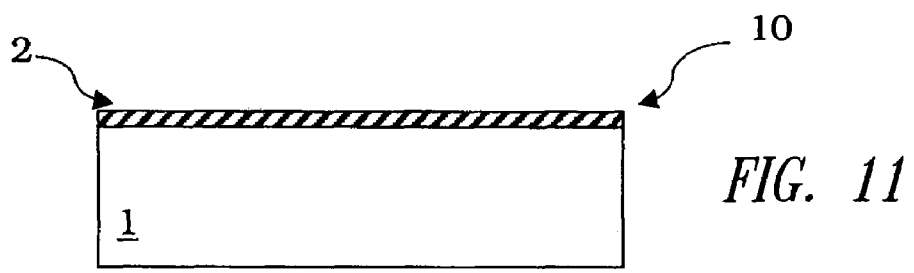
Figure 12:
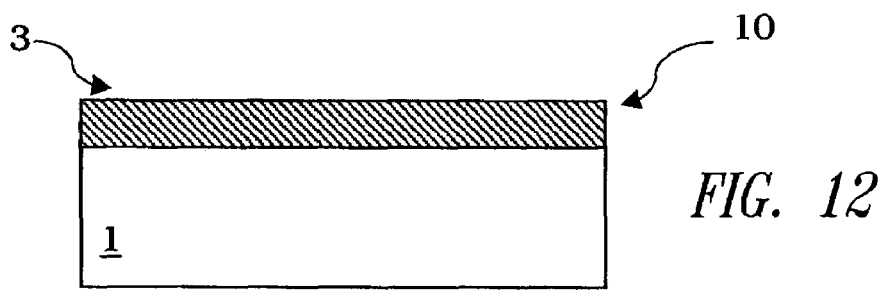

In particular, a layer 2 of silicon nitride is formed over the polysilicon layer 1 in the embodiment of FIG. 10. This layer 2 can be formed by LPCVD (Low-Pressure Chemical Vapor Deposition), RTCVD (Rapid Thermal Chemical Vapor Deposition), PECVD (Plasma-Enhanced Chemical Vapor Deposition), or by directly nitriding the surface (as by plasma or thermal nitriding) in either batch or single-wafer systems.

The silicon nitride layer 2 functions to inhibit diffusion of any oxidizing species ($O_2$, O, OH, $H_2O$), as may be present in the gas mixtures employed for subsequent thermal treatments to the step of forming the interpoly dielectric layer.

Such oxidizing species can also originate from the subsequent process of forming, and optionally densifying, the interpoly dielectric layers.

Advantageously, the nitride layer 2 is provided as a very thin layer (e.g., about 3 nm thick) in order to keep the overall thickness of the interpoly dielectric layer 11 low.

Preferably, the interpoly dielectric layer 11 is formed over the nitride layer 2.

A bottom dielectric layer 3 is then formed over the nitride layer 2.

The bottom dielectric layer 3 is advantageously formed as in the embodiment of FIG. 3.

Figure 13:
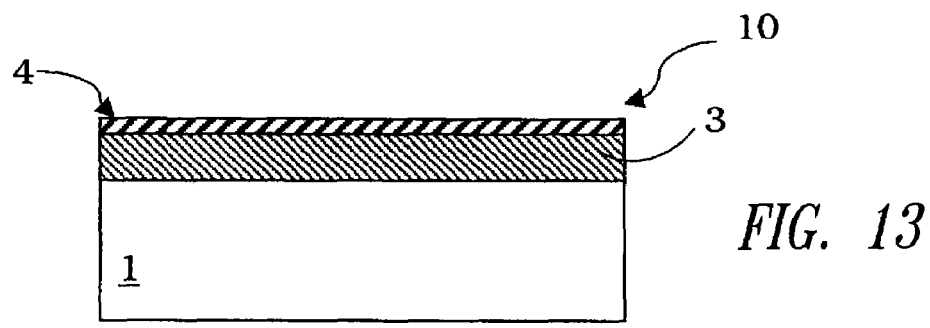
Figure 14:
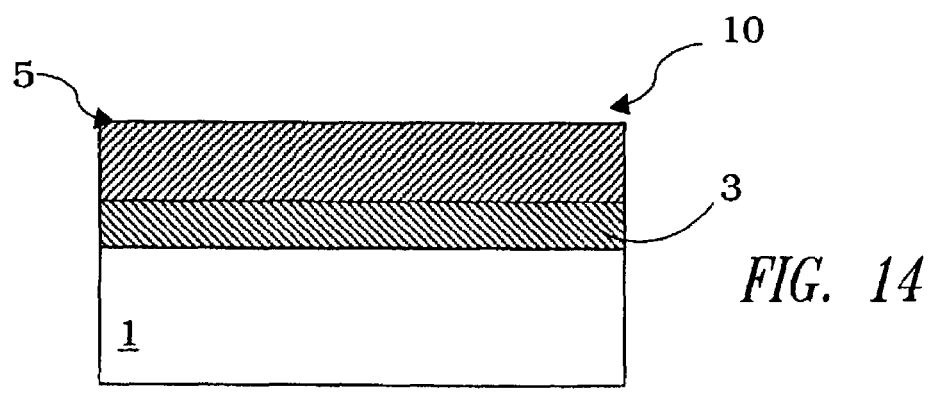

If the nitride layer 2 has not been formed over the polysilicon layer 1, an ultra-thin layer 4 of silicon nitride is now formed over the bottom dielectric layer 3, as shown in FIG. 13. This layer 4 of silicon nitride may be formed in the same way as the previous layer 2 of silicon nitride.

According to the invention, a dielectric layer 5 having a high dielectric constant, in particular higher than 10, is formed over the ultra-thin nitride layer 4. This dielectric layer 5 with a high dielectric constant has the same characteristics as the dielectric layer 5 with a high dielectric constant of the previously described embodiments, and it may be densified as in the embodiment of FIG. 2.

Figure 15:
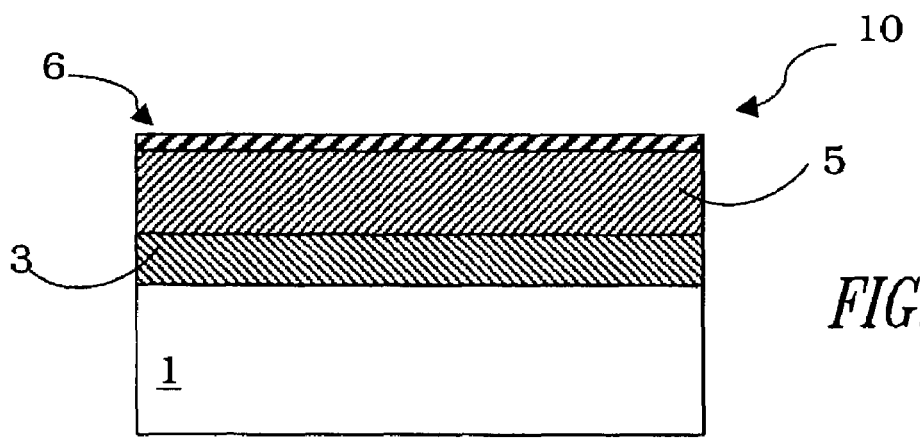
Figure 16:
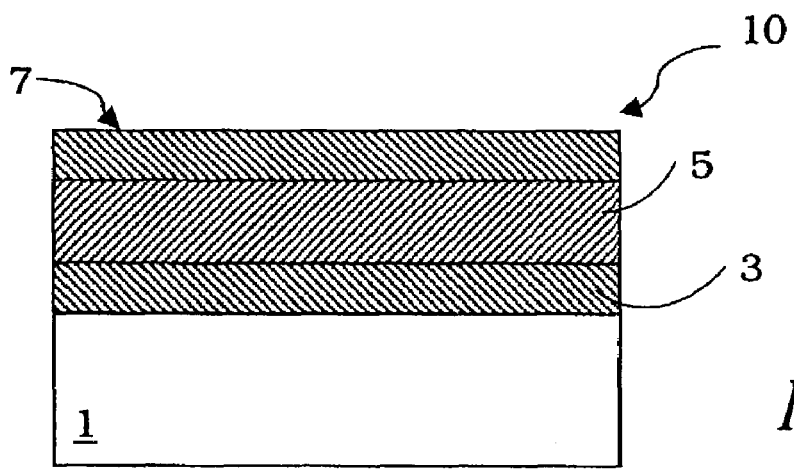

Advantageously, if no nitride layers have been provided, the gate region 10 of the memory cell according to the invention is formed by depositing an ultra-thin layer 6 of silicon nitride onto said dielectric layer 5 with a high dielectric constant, as shown in FIG. 15. This layer 6 of silicon nitride may be formed the same way as the silicon nitride layers 2 and 4 previously described.

A top dielectric layer 7 is then formed over the ultra-thin layer 6, if the ultra-thin layer 6 is provided. The top dielectric layer 7 may be a layer of silicon dioxide or a layer of a dielectric material whose dielectric constant value is in the range of 3.9 to 10. The interpoly dielectric layer 11 is thus completed.

The top dielectric layer 7 is advantageously formed as in the embodiment of FIG. 6.

Figure 17:
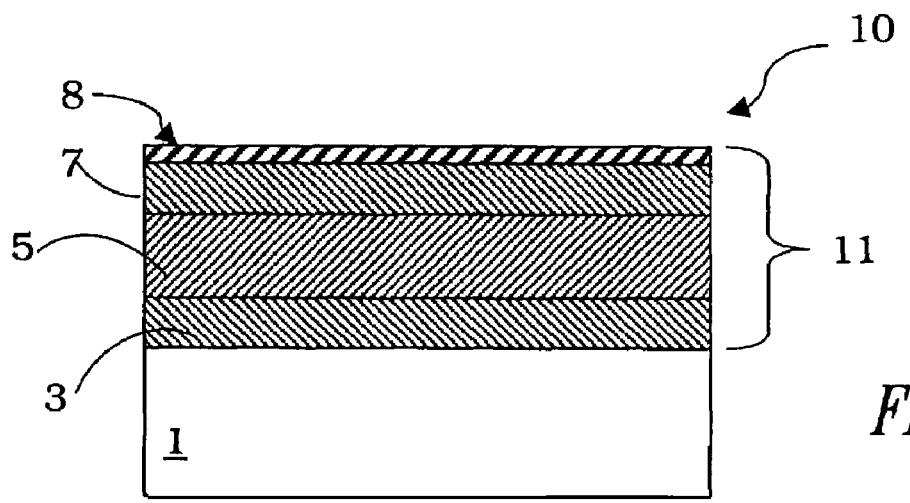

If no nitride layers have been provided before or inside the interpoly dielectric layer 11, an ultra-thin layer 8 of silicon nitride is now deposited onto the top dielectric layer 7, as shown in FIG. 17. This layer 8 of silicon nitride may be formed in the same way as the silicon nitride layers 2, 4, 6 previously described.

This ultra-thin layer 8 of silicon nitride is densified by thermal treatment (using either nitrogen or steam or oxygen, $N_2$ or $H_2O$ or $O_2$).

The gate region 10 of the memory cell is then finished conventionally by forming the control gate region in the interpoly dielectric layer 11.

Nothing prevents using a barrier layer of silicon nitride in the previously described embodiments of the invention as well.

To summarize, the process of the embodiments disclosed herein provides reduced equivalent electrical thickness dimensions of the interpoly dielectric layer 11 to be achieved, with the overall thickness of the latter unchanged or increased, using high dielectric constant layers. This allows an electrical thickness of up to 5 equivalent nanometers, i.e., 50 nm technologies, to be achieved.

Particularly by using materials of very high dielectric constant ($K \leq 50$), the selection of the relative thickness of the dielectric layers 3, 5, 7, comprising the proposed stack construction for the interpoly dielectric layer 11 of the gate region 10, is made more flexible and modular.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

The invention claimed is:

1. A process for manufacturing a non-volatile memory cell integrated in a semiconductor substrate and having a gate region comprised of a floating gate region and a control gate region, the process comprising the steps of:
- depositing a first dielectric layer onto the semiconductor substrate;
- depositing a first semiconductor layer onto said first dielectric layer to form said floating gate region of said gate region;
- defining said floating gate region of said gate region in said first semiconductor layer;
- depositing a second dielectric layer, having a higher dielectric constant than 10 and a thickness of less than 75 Angstroms, onto said first semiconductor layer;
- depositing a third dielectric layer between said first semiconductor layer and said second dielectric layer; and
- depositing a fourth dielectric layer onto said second dielectric layer, wherein said third and fourth dielectric layers each comprise a layer of aluminum oxide.

2. The process for manufacturing the non-volatile memory cell of claim 1, wherein said second dielectric layer is a single layer of a metal aluminate.

3. The process for manufacturing the non-volatile memory cell of claim 2, wherein said second dielectric layer comprises transition metals.

4. The process for manufacturing the non-volatile memory cell of claim 3, wherein said transition metal comprising one of either hafnium or zirconium.

5. The process for manufacturing the non-volatile memory cell of claim 1, wherein said second dielectric layer is a single layer of a metal silicate.

6. The process for manufacturing the non-volatile memory cell of claim 1, wherein said second dielectric layer comprises a plurality of layers of different materials having a dielectric constant higher than or equal to 3.9.

7. The process for manufacturing the non-volatile memory cell of claim 1, wherein said second dielectric layer is formed by a CVD technique.

8. The process for manufacturing the non-volatile memory cell of claim 1, wherein said second dielectric layer is formed by a PVD technique.

9. The process for manufacturing the non-volatile memory cell of claim 1, wherein said second dielectric layer is formed by an MBE deposition technique.

10. The process for manufacturing the non-volatile memory cell of claim 1, wherein the dielectric constant of said third and fourth dielectric layers is in the range of 3.9 to 10.

11. The process for manufacturing the non-volatile memory cell of claim 1, wherein said third and fourth dielectric layers are each formed by a CVD technique.

12. The process for manufacturing the non-volatile memory cell of claim 1, comprising a barrier layer formed over said first semiconductor layer.

13. The process for manufacturing a non-volatile memory cell of claim 12, wherein said barrier layer is a layer of silicon nitride.

14. The process for manufacturing the non-volatile memory cell of claim 13, wherein said silicon nitride layer is formed by a CVD technique.

15. The process for manufacturing the non-volatile memory cell of claim 13, wherein said silicon nitride layer is formed by direct surface nitriding.

16. The process for manufacturing the non-volatile memory cell of claim 1, comprising a barrier layer formed over said third dielectric layer.

17. The process for manufacturing the non-volatile memory cell of claim 1, comprising a barrier layer formed over said second dielectric layer.

18. The process for manufacturing the non-volatile memory cell of claim 1, wherein said second and fourth dielectric layers are subjected to a densifying treatment.

19. A process for manufacturing the non-volatile memory cell integrated in a simiconductor substrate and having a gate region comprised of a floating gate region and a control gate region, the process comprising the steps of;
- depositing a first dielectric layer onto said semiconductor substrate;
- depositing a first semiconductor layer onto said first dielectric layer to form said floating gate region of said gate region;
- defining said floating gate region of said gate region in said first semiconductor layer;
- depositing a second dielectric layer, having a higher dielectric constant than 10 and a thickness of less than 75 Angstroms, onto said first semiconductor layer;
- depositing a third dielectric layer between said first semiconductor layer and said second dielectric layer;
- depositing a fourth dielectric layer onto said second dielectric layer; and
- a barrier layer formed over said fourth dielectric layer.

20. The process for manufacturing the non-volatile memory cell of claim 19, wherein said second dielectric layer is a single layer of a metal aluminate.

21. The process for manufacturing the non-volatile memory cell of claim 20, wherein said dielectric layer comprises transition metals.

22. The process for manufacturing the non-volatile memory cell of claim 21, wherein said transition metal comprising one of either hafnium or zirconium.

23. The process for manufacturing the non-volatile memory cell of claim 19, wherein said second dielectric layer is a single layer of a metal silicate.

24. The process for manufacturing the non-volatile memory cell of claim 19, wherein said second dielectric layer comprises a plurality of layers of different materials having a dielectric constant higher than or equal to 3.9.

25. The process for manufacturing the non-volatile memory cell of claim 19, wherein said second dielectric layer is formed by a CVD technique.

26. The process for manufacturing the non-volatile memory cell of claim 19, wherein said second dielectric layer is formed by a PVD technique.

27. The process for manufacturing the non-volatile memory cell of claim 19, wherein said second dielectric layer is formed by an MBE deposition technique.

28. The process for manufacturing the non-volatile memory cell of claim 19, wherein the dielectric constant of said third and fourth dielectric layers is in the range of 3.9 to 10.

29. The process for manufacturing the non-volatile memory cell of claim 19, wherein said third and fourth dielectric layers each comprise a layer of aluminum oxide.

30. The process for manufacturing the non-volatile memory cell of claim 19, wherein said third and fourth dielectric layers are each formed by a CVD technique.

31. The process for manufacturing a non-volatile memory cell of claim 19, wherein said baffler layer is a layer of silicon nitride.

32. The process for manufacturing the non-volatile memory cell of claim 31, wherein said silicon nitride layer is formed by a CVD technique.

33. The process for manufacturing the non-volatile memory cell of claim 31, wherein said silicon nitride layer is formed by direct surface nitriding.

34. The process for manufacturing the non-volatile memory cell of claim 19, wherein said second and fourth dielectric layers are subjected to a densifying treatment.

35. A process for manufacturing a non-volatile memory cell having at least one gate region, the process comprising:
   forming a first dielectric layer over the substrate;
   forming a first semiconductor layer over the first dielectric layer;
   forming a first aluminum oxide layer over the first semiconductor layer;
   forming a second dielectric layer over the first a aluminum oxide layer, and
   forming a second aluminum oxide layer over the second dielectric layer.

36. The process of claim 35, wherein the second dielectric layer comprises a transition metal.

37. The process of claim 35, wherein the second dielectric layer is formed by a PVD technique.

38. A process for manufacturing a non-volatile memory cell having at least one gate region, the process comprising:
   forming a dielectric layer over the substrate;
   forming a first semiconductor layer over the dielectric layer; and
   forming a second dielectric layer over the first semiconductor layer, the second dielectric layer having a higher dielectric constant than 10 and a thickness of less than 75 Angstroms and comprising three dielectric sublayers, the first and third of the three dieleetric sublayers comprising aluminum oxide.

39. The process of claim 38, wherein the second of the three dielectric sublayers comprises a transition metal.

40. The process of claim 38, wherein the second dielectric layer is formed by an MBE deposition technique.

41. A process for manufacturing a non-volatile memory cell, being integrated in a semiconductor substrate and having a gate region comprised of a floating gate region and a control gate region, the process comprising the steps of:
   depositing a first dielectric layer onto said semiconductor substrate;
   depositing a first semiconductor layer onto said first dielectric layer to form said floating gate region of said gate region;
   defining said floating gate region of said gate region in said first semiconductor layer;
   depositing a first intermediate dielectric layer of aluminum oxide on the first semiconductor layer;
   depositing a second dielectric layer onto said first semiconductor layer by one of a CVD and an MBE deposition technique, the second dielectric layer having a higher dielectric constant than 10 and a thickness of less than 75 Angstroms; and
   depositing a second intermediate dielectric layer of aluminum oxide on the second dielectric layer.

42. The process for manufacturing the non-volatile memory cell of claim 41, wherein said second dielectric layer is a single layer of a metal aluminate.

43. The process for manufacturing the non-volatile memory cell of claim 41, wherein said second dielectric layer is a single layer of a metal silicate.

44. The process for manufacturing the non-volatile memory cell of claim 41, wherein said second dielectric layer comprises transition metals.

45. The process for manufacturing the non-volatile memory cell of claim 44, wherein said transition metal comprises one of either hafnium or zirconium.

46. The process for manufacturing the non-volatile memory cell of claim 41, wherein said second dielectric layer comprises a plurality of layers of different materials having a dielectric constant higher than or equal to 3.9.

47. The process for manufacturing the non-volatile memory cell of claim 41, wherein said second dielectric layer is formed by a CVD technique.

48. The process for manufacturing the non-volatile memory cell of claim 41, wherein the dielectric constant of said third and fourth dielectric layers is in the range of 3.9 to 10.

49. The process for manufacturing the non-volatile memory cell of claim 41, wherein said first and second intermediate dielectric layers are each formed by a CVD technique.

50. The process for manufacturing the non-volatile memory cell of claim 41, comprising a barrier layer formed over said first semiconductor layer.

51. The process for manufacturing a non-volatile memory cell of claim 50, wherein said barrier layer is a layer of silicon nitride.

52. The process for manufacturing the non-volatile memory cell of claim 51, wherein said silicon nitride layer is formed by a CVD technique.

53. The process for manufacturing the non-volatile memory cell of claim 51, wherein said silicon nitride layer is formed by direct surface nitriding.

54. The process for manufacturing the non-volatile memory cell of claim 41, comprising a barrier layer formed over said first intermediate dielectric layer.

55. The process for manufacturing the non-volatile memory cell of claim 41, comprising a barrier layer formed over said second dielectric layer and below the second intermediate dielectric layer.

56. The process for manufacturing the non-volatile memory cell of claim 41, comprising a barrier layer formed over said second intermediate dielectric layer.

57. The process for manufacturing the non-volatile memory cell of claim 41, wherein said second said second dielectric layer and said second intermediate dielectric layer are subjected to a densifying treatment.

58. A process for manufacturing a non-volatile memory cell, being integrated in a semiconductor substrate and having a gate region comprised of a floating gate region and a control gate region, the process comprising the steps of:
   depositing a first dielectric layer onto said semiconductor substrate;
   depositing a first semiconductor layer onto said first dielectric layer to form said floating gate region of said gate region;
   defining said floating gate region of said gate region in said first semiconductor layer;
   depositing a second dielectric layer deposited onto said first semiconductor layer by one of a CVD and a PVD deposition technique, the second dielectric layer having a higher dielectric constant than 10 and a thickness of less than 75 Angstroms;
   depositing a third layer of dielectric layer between said first semiconductor layer and said second dielectric layer; and
   depositing a fourth layer of dielectric layer onto said second dielectric layer, wherein said third and fourth dielectric layers each comprise a layer of aluminum oxide.

59. The process for manufacturing the non-volatile memory cell of claim 58, wherein said second dielectric layer is a single layer of a metal aluminate.

60. The process for manufacturing the non-volatile memory cell claim 59, wherein said second dielectric layer comprises transition metals.

61. The process for manufacturing the non-volatile memory cell of claim 60, wherein said transition metal comprising one of either hafnium or zirconium.

62. The process for manufacturing the non-volatile memory cell of claim 58, wherein said second dielectric layer is a single layer of a metal silicate.

63. The process for manufacturing the non-volatile memory cell of claim 58, wherein said second dielectric layer comprises a plurality of layers of different materials having a dielectric constant higher than or equal to 3.9.

64. The process for manufacturing the non-volatile memory cell of claim 58, wherein said second dielectric layer is formed by a CVD technique.

65. The process for manufacturing the non-volatile memory cell of claim 58 wherein the dielectric constant of said third and fourth dielectric layers is in the range of 3.9 to 10.

66. The process for manufacturing the non-volatile memory cell of claim 58, wherein said third and fourth dielectric layers are each formed by a CVD technique.

67. The process for manufacturing the non-volatile memory cell of claim 58, comprising a barrier layer formed over said first semiconductor layer.

68. The process for manufacturing a non-volatile memory cell of claim 67, wherein said barrier layer is a layer of silicon nitride.

69. The process for manufacturing the non-volatile memory cell of claim 68, wherein said silicon nitride layer is formed by a CVD technique.

70. The process for manufacturing the non-volatile memory cell of claim 68, wherein said silicon nitride layer is formed by direct surface nitriding.

71. The process for manufacturing the non-volatile memory cell of claim 58, comprising a barrier layer formed over said third dielectric layer.

72. The process for manufacturing the non-volatile memory cell of claim 58, comprising a barrier layer formed over said second dielectric layer.

73. The process for manufacturing the non-volatile memory cell of claim 58, wherein said second and fourth dielectric layers are subjected to a densifying treatment.

74. A process for manufacturing a non-volatile memory cell integrated in a semiconductor substrate and having a gate region comprised of a floating gate region and a control gate region, the process comprising the steps of;
    depositing a first dielectric layer onto said semiconductor substrate;
    depositing a first semiconductor layer onto said first dielectric layer to form said floating gate region of said gate region;
    defining said floating gate region of said gate region in said first semiconductor layer;
    depositing a second dielectric layer deposited onto said first semiconductor layer by one of a CVD and a PVD deposition technique, the second dielectric layer having a higher dielectric constant the 10 and a thickness of less the 75 Angstroms;
    depositing a third dielectric layer between said first semiconductor layer and said second dielectric layer; and
    depositing a fourth dielectric layer onto said second dielectric layer; and
    a barrier layer formed over said fourth dielectric layer.

75. The process for manufacturing the non-volatile memory cell of claim 74, comprising depositing a third dielectric layer between said first semiconductor layer and said second dielectric layer.

76. The process for manufacturing the non-volatile memory cell of claim 74, comprising depositing a fourth dielectric layer onto said second dielectric layer.

77. The process for manufacturing the non-volatile memory cell of claim 76, wherein said dielectric layer comprises transition metals.

78. The process for manufacturing the non-volatile memory cell of claim 77, wherein said transition metal comprises one of either hafnium or zirconium.

79. The process for manufacturing the non-volatile memory cell of claim 74, wherein said second dielectric layer is a single layer of a metal silicate.

80. The process for manufacturing the non-volatile memory cell of claim 74, wherein said second dielectric layer comprises a plurality of layers of different materials having a dielectric constant higher than or equal to 3.9.

81. The process for manufacturing the non-volatile memory cell of claim 74, wherein said second dielectric layer is formed by a CVD technique.

82. The process for manufacturing the non-volatile memory cell of claim 74, wherein the dielectric constant of said third and fourth dielectric layers is in the range of 3.9 to 10.

83. The process for manufacturing the non-volatile memory cell of claim 74, wherein said third and fourth dielectric layers each comprise a layer of aluminum oxide.

84. The process for manufacturing the non-volatile memory cell of claim 74, wherein said third and fourth dielectric layers are each formed by a CVD technique.

85. The process for manufacturing the non-volatile memory cell of claim 74, comprising a barrier layer formed over said first semiconductor layer.

86. The process for manufacturing the non-volatile memory cell of claim 74, comprising a barrier layer formed over said third dielectric layer.

87. The process for manufacturing a non-volatile memory cell of claim 86, wherein said barrier layer is a layer of silicon nitride.

88. The process for manufacturing the non-volatile memory cell of claim 87, wherein said silicon nitride layer is formed by a CVD technique.

89. The process for manufacturing the non-volatile memory cell of claim 87, wherein said silicon nitride layer is formed by direct surface nitriding.

90. The process for manufacturing the non-volatile memory cell of claim 74, comprising a barrier layer formed over said second dielectric layer.

91. The process for manufacturing the non-volatile memory cell of claim 74, wherein said second and fourth dielectric layers are subjected to a densifying treatment.

* * * * *

UNITED STATES PATENT AND TRADEMARK OFFICE
CERTIFICATE OF CORRECTION

PATENT NO. : 7,262,098 B2
APPLICATION NO. : 10/323615
DATED : August 28, 2007
INVENTOR(S) : Mauro Alessandri et al.

It is certified that error appears in the above-identified patent and that said Letters Patent is hereby corrected as shown below:

Column 8
Line 5, "simiconductor" should read as -- semiconductor --.

Column 9
Line 8, "layer over the first a aluminum oxide layer..." should read as -- layer over the first aluminum oxide layer... --.

Line 10, "dieleetric" should read as -- dielectric --.

Signed and Sealed this

Twenty-fourth Day of June, 2008

JON W. DUDAS
*Director of the United States Patent and Trademark Office*